US012677646B2

(12) United States Patent
Li et al.

(10) Patent No.: US 12,677,646 B2
(45) Date of Patent: Jul. 7, 2026

(54) SEMICONDUCTOR STRUCTURE INCLUDING CAP LAYER OF TWO-DIMENSIONAL MATERIAL AND METHOD FOR MANUFACTURING THE SAME

(71) Applicant: TAIWAN SEMICONDUCTOR MANUFACTURING COMPANY, LTD., Hsinchu (TW)

(72) Inventors: Shu-Wei Li, Hsinchu (TW); Hans Hsu, Hsinchu (TW); Chien-Hsin Ho, Hsinchu (TW); Yu-Chen Chan, Hsinchu (TW); Blanka Magyari-Kope, Hsinchu (TW); Shin-Yi Yang, Hsinchu (TW); Ming-Han Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 391 days.

(21) Appl. No.: 18/447,561

(22) Filed: Aug. 10, 2023

(65) Prior Publication Data

US 2025/0054810 A1 Feb. 13, 2025

(51) Int. Cl.
*H01L 21/768* (2006.01)
*H10W 20/00* (2026.01)
*H10W 20/42* (2026.01)

(52) U.S. Cl.
CPC ....... *H10W 20/033* (2026.01); *H10W 20/057* (2026.01); *H10W 20/075* (2026.01); *H10W 20/081* (2026.01); *H10W 20/42* (2026.01)

(58) Field of Classification Search
CPC ......... H01L 21/76843; H01L 21/76802; H01L 21/76832; H01L 21/76879; H01L 23/5226; H01L 23/53238; H01L 23/53252; H01L 23/53266; H01L 21/76834; H01L 21/76849
See application file for complete search history.

(56) References Cited

U.S. PATENT DOCUMENTS

2022/0238323 A1* 7/2022 Clark ................ H01L 21/76832
2023/0187342 A1* 6/2023 Lanzillo ............ H01L 21/76883
257/774
2024/0130242 A1* 4/2024 Zhao ...................... H10N 50/01

* cited by examiner

*Primary Examiner* — Karen Kusumakar
(74) *Attorney, Agent, or Firm* — Birch, Stewart, Kolasch & Birch, LLP

(57) ABSTRACT

A semiconductor structure includes a semiconductor substrate, an interconnect structure disposed on the semiconductor substrate and including a conductive interconnect; and a cap layer disposed on the interconnect structure. The cap layer includes a cap portion disposed on the conductive interconnect. The cap portion includes a plurality of two-dimensional material sheets stacked on each other and has a lower surface proximate to the conductive interconnect. The lower surface of the cap portion is formed with a plurality of dangling bonds such that the cap portion is adhered to the conductive interconnect through the dangling bonds.

20 Claims, 11 Drawing Sheets

10

| | |
|---|---|
| Forming a metal layer | S01 |
| Forming a cap layer made of a two-dimensional material on metal lines of the metal layer | S02 |
| Forming an etch stop layer | S03 |

511

511

SEMICONDUCTOR STRUCTURE INCLUDING CAP LAYER OF TWO-DIMENSIONAL MATERIAL AND METHOD FOR MANUFACTURING THE SAME

BACKGROUND

The semiconductor integrated circuit (IC) industry has experienced tremendous advancements over the past decades and is still experiencing vigorous development. With the dramatic advances in IC design, new generations of ICs have smaller and more complex circuits. A damascene process, such as a single damascene process or a dual damascene process, is one of the techniques used for forming back-end-of-line (BEOL) interconnect structures, which include alternating metal (e.g., copper) and inter-layer dielectric (ILD) layers, with conductive vias extending through the ILD layers to connect corresponding ones of metal lines of the metal layers. The interconnect structures play an important role in miniaturization and electrical performance of the new generations of ICs. In the process for forming the interconnect structures, a cap layer may be formed on, for example, metal lines of the metal layers to improve the performance of the interconnect structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
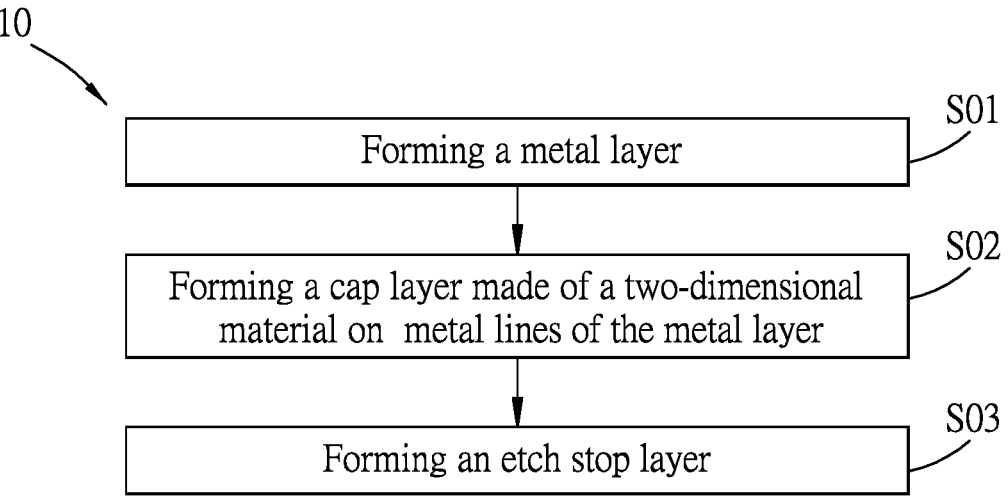
FIG. 1 is a flow diagram illustrating a method for manufacturing a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "downwardly, "bottom," "upper," "lower," "over," "below," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For the purposes of this specification and appended claims, unless otherwise indicated, all numbers expressing amounts, sizes, dimensions, proportions, shapes, formulations, parameters, percentages, quantities, characteristics, and other numerical values used in the specification and claims, are to be understood as being modified in all instances by the term "about" even though the term "about" may not expressly appear with the value, amount or range. Accordingly, unless indicated to the contrary, the numerical parameters set forth in the following specification and attached claims are not and need not be exact, but may be approximate and/or larger or smaller as desired, reflecting tolerances, conversion factors, rounding off, measurement error and the like, and other factors known to those of skill in the art depending on the desired properties sought to be obtained by the presently disclosed subject matter. For example, the term "about," when referring to a value can be meant to encompass variations of, in some aspects ±10%, in some aspects ±5%, in some aspects ±2.5%, in some aspects ±1%, in some aspects ±0.5%, and in some aspects ±0.1% from the specified amount, as such variations are appropriate to perform the disclosed methods or employ the disclosed compositions.

A damascene process, such as a single damascene process or a dual damascene process, is one of the techniques used for forming BEOL interconnect structures, which include alternating metal (e.g., copper) and ILD layers, with conductive vias extending through the ILD layers to connect corresponding ones of metal lines of the metal layers. The interconnect structures play an important role in miniaturization and electrical performance of the new generations of ICs. In the process for forming the interconnect structures, a cap layer may be formed on the metal lines to improve the performance of the interconnect structures. A layer made of meal (for example, but not limited to, a layer made of cobalt) may be used as the cap layer to be disposed on the metal lines so as to improve electro-migration (EM) of the interconnect structures. However, resistance of the metal layer is a key concern when the dimension of the interconnect structures is miniaturized. A two-dimensional material (for example, but not limited to, graphene) is alternatively used for forming the cap layer disposed on the metal lines to reduce the resistance of the metal lines. However, the application of the cap layer made of the two-dimensional material is limited due to inferior adhesion of the cap layer to the metal lines. Therefore, the present disclosure is directed to forming a cap layer made of a two-dimensional material (for example, but not limited to, graphene) on the metal lines in which adhesion of the cap layer to the metal lines is improved and the reduced resistance of the metal lines contributed by the two-dimensional material is maintained.

Figure 2:
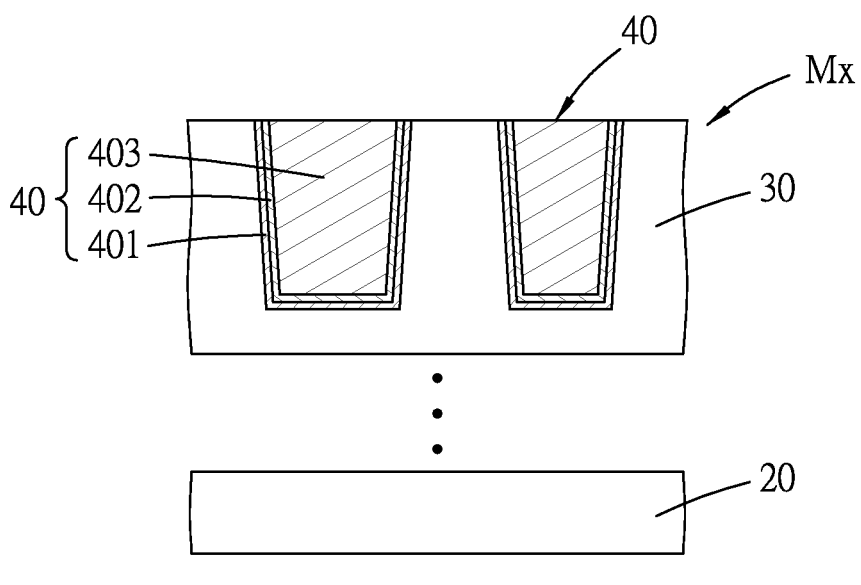
FIGS. 2 to 4 illustrate schematic views of some intermediate stages of the method depicted in FIG. 1 in accordance with some embodiments.
Figure 3:
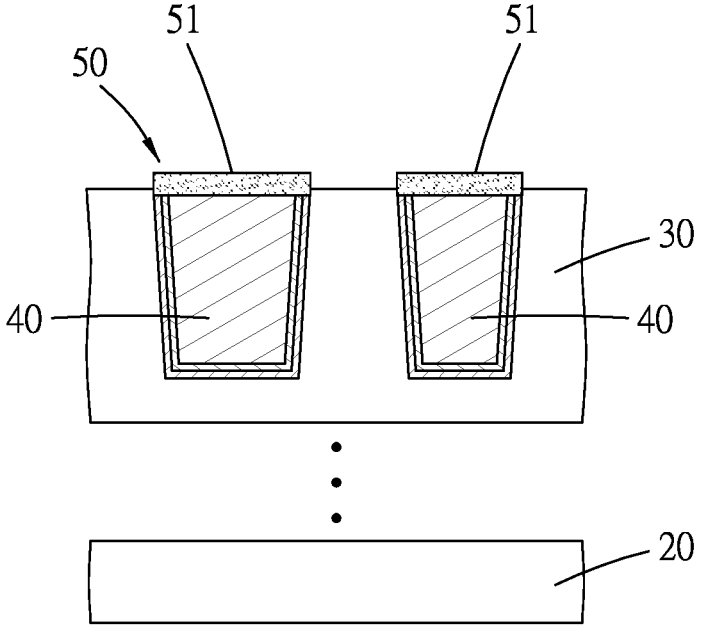
Figure 4:
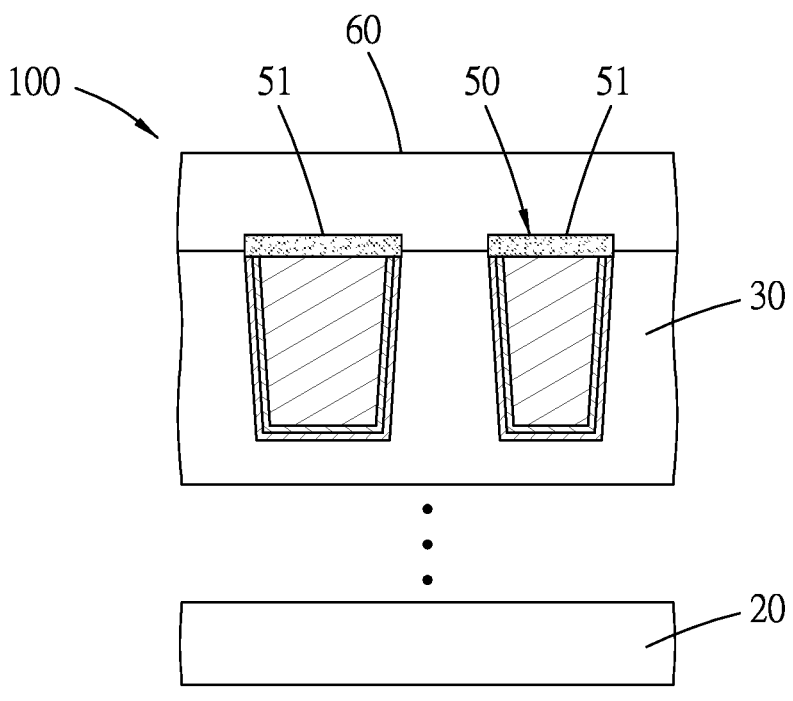

FIG. 1 is a flow diagram illustrating a method 10 for manufacturing a semiconductor structure (for example, a semiconductor structure 100 shown in FIG. 4) in accordance with some embodiments. FIGS. 2 to 4 illustrate schematic views of some intermediate stages of the method 10 in accordance with some embodiments. Some repeating structures and some components are omitted in FIGS. 2 to 4 for the sake of brevity. Additional steps can be provided before, after or during the method 10, and some of the steps described herein may be replaced by other steps or be eliminated. Similarly, further additional features may be present in the semiconductor device 100, and/or features present may be replaced or eliminated in additional embodiments.

Referring to FIG. 1 and the example illustrated in FIG. 2, the method 10 begins at step S01, where a metal layer (Mx) is formed on a substrate 20. The metal layer (Mx) includes a dielectric layer 30 and a plurality of metal lines 40 disposed in the dielectric layer 30 and spaced apart from each other. The metal layer (Mx) is configured as an interconnect structure, and each of the metal lines 40 is configured as a conductive interconnect.

In some embodiments, the substrate 20 is a semiconductor substrate which may include, for example, but not limited to, an elemental semiconductor or a compound semiconductor. The elemental semiconductor includes a single species of atoms, such as silicon (Si) or germanium (Ge) in column XIV of the periodic table, and may be in a crystal form, a polycrystalline form, or an amorphous form. Other suitable materials are within the contemplated scope of the present disclosure. The compound semiconductor includes two or more elements, and examples thereof may include, but not limited to, silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and gallium indium arsenide phosphide (GaInAsP). Other suitable materials are within the contemplated scope of the present disclosure. The compound semiconductor may have a gradient feature in which the compositional ratio thereof changes from one location to another location therein. The compound semiconductor may be formed over a silicon substrate. The compound semiconductor may be strained. In some embodiments, the semiconductor substrate may include a multilayer compound semiconductor structure. In some embodiments, the semiconductor substrate may be a semiconductor on insulator (SOI) (e.g., silicon germanium on insulator (SGOI)). Generally, an SOI substrate includes a layer of a semiconductor material such as epitaxial silicon, germanium, silicon germanium, or combinations thereof. Other suitable materials are within the contemplated scope of the present disclosure. The SOI substrate may be doped with a P-type dopant, for example, but not limited to, boron (Br), aluminum (Al), or gallium (Ga). Other suitable materials are within the contemplated scope of the present disclosure. Alternatively, the SOI substrate may be doped with an N-type dopant, for example, but not limited to, nitrogen (N), phosphorus (P), or arsenic (As). Other suitable materials are within the contemplated scope of the present disclosure. In some embodiments, the semiconductor substrate may further include various active regions, for example, the active regions configured for an N-type metal oxide semiconductor (NMOS) transistor device or the active regions configured for a P-type metal oxide semiconductor (PMOS) transistor device. In some embodiments, the active regions may includes source/drain (S/D) regions of a transistor device. It is noted that each of the source/drain regions may refer to a source or a drain, individually or collectively dependent upon the context.

In some embodiments, the metal layer (Mx) is formed on the substrate 20 by a single damascene process, which may include: depositing the dielectric layer 30 on the substrate 20, forming a plurality of trenches (not shown) in the dielectric layer 30, and forming a plurality of the metal lines 40 in the trenches, respectively.

In some embodiments, the dielectric layer 30 may include, for example, but not limited to, silicon oxide (SiOx), silicon nitride (SiNx), silicon oxynitride (SiON), silicon carbonitride (SiCN), silicon oxycarbide (SiOC), silicon oxycarbonitride (SiOCN), silicon carbide (SiC), an extreme low-k (ELK) dielectric material, or combinations thereof. Other suitable low-k dielectric materials are within the contemplated scope of the present disclosure. In some embodiments, the dielectric layer 30 may be formed by a suitable deposition process as is known in the art of semiconductor fabrication, for example, but not limited to, chemical vapor deposition (CVD), atomic layer deposition (ALD), spin coating, thermal CVD, or the like. Other suitable deposition techniques are within the contemplated scope of the present disclosure. In some embodiments, the dielectric layer 30 has a thickness ranging from about 1 Å to about 500 Å. In some embodiments, the dielectric layer 30 has a k value (i.e., a dielectric constant) ranging from about 1.5 to about 3.9.

A plurality of trenches (not shown) are then formed in the dielectric layer 30. Each of trenches is recessed downwardly from an upper surface of the dielectric layer 30, and includes a bottom surface and a sidewall surface extending downwardly from the upper surface of the dielectric layer 30 to terminate at the bottom surface. In some embodiments, the trenches may be formed by the following processes.

A mask layer (not shown, for example, but not limited to, a hard mask layer) is deposited on the dielectric layer 30. Examples of a material suitable for forming the mask layer include, for example, but not limited to, tungsten nitride, tungsten carbide, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, and combinations thereof. Other suitable materials are within the contemplated scope of the present disclosure. The mask layer may be formed on the dielectric layer 30 by a suitable deposition process as is known in the art of semiconductor fabrication, such as physical vapor deposition (PVD), CVD. ALD, plasma-enhanced ALD (PEALD), thermal ALD, plasma-enhanced CVD (PECVD), or spin-on coating. Other suitable techniques are within the contemplated scope of the present disclosure. A photoresist layer (not shown) is then formed on the mask layer by a suitable fabrication technique known to those skilled in the art of semiconductor fabrication, for example, but not limited to, a spin-on technique. Other suitable techniques are within the contemplated scope of the present disclosure. The photoresist layer is then patterned using a suitable photolithography technique to form a pattern of recesses. For example, the photoresist layer is exposed to light for patterning, followed by developing to form the pattern of the recesses. The pattern of the recesses formed in the photoresist layer is transferred to the mask layer using one or more etching processes, for example, but not limited to, a wet etching process, a dry etching process, a reactive ion etching process, a neutral beam etching process, or the like. After the pattern of the recesses is transferred to the mask layer, the photoresist layer may be removed by, for example, but not limited to, an ashing process, such that a patterned mask layer (not shown) is formed on the dielectric layer 30. Thereafter, the dielectric layer 30 is patterned by one or more etching processes (for example, but not limited to, a dry etching process, a wet etching process, or a combination thereof) through a pattern of openings formed in the patterned mask layer to form the trenches. After the trenches are formed, the patterned mask layer is removed by, for example, but not limited to, a dry etching process.

The metal lines 40 are then formed in the trenches, respectively. In some embodiments, each of the metal lines 40 includes a barrier layer 401 conformally formed on the bottom surface and the sidewall surface of a corresponding one of trenches, a liner layer 402 conformally formed on the barrier layer 401, and a bulk metal region 403 disposed on the liner layer 402 opposite to the barrier layer 401. In some embodiments, the bulk metal region 403 may be made of a metal material. In some embodiments, the metal material for forming the bulk metal region 403 may include, for example, but not limited to, metals (e.g., copper (Cu), silver (Ag), gold (Au), Al, nickel (Ni), Co, ruthenium (Ru), iridium (Ir), platinum (Pt), palladium (Pd), osmium (Os), tungsten (W), molybdenum (Mo), tantalum (Ta), or the like), alloys thereof possessing promising conductive properties, or the like. Other suitable metal materials are within the contemplated scope of the present disclosure. The liner layer 402 is used to enhance filling of the metal material into the trenches and to enhance adhesion the bulk metal region 403 to the barrier layer 401. In some embodiments, the liner layer 402 may include, for example, but not limited to, a two-dimensional material (for example, but not limited to, molybdenum disulfide ($MoS_2$), tantalum disulfide ($TaS_2$), tungsten disulfide ($WS_2$), molybdenum diselenide ($MoSe_2$), tantalum diselenide ($TaSe_2$), tungsten diselenide ($WSc_2$), molybdenum ditelluride ($MoTe_2$), tantalum ditelluride ($TaTe_2$), tungsten ditelluride ($WTe_2$), or the like), metals (for example, but not limited to, cobalt (Co), ruthenium (Ru), tantalum (Ta), niobium (Nb), aluminum (Al), tungsten (W), or the like), or alloys thereof. Other suitable metal materials are within the contemplated scope of the present disclosure. The barrier layer 401 is used to prevent the metal material of the bulk metal region 403 from diffusing into the dielectric layer 30. In some embodiments, the barrier layer 401 may include, for example, but not limited to, tantalum (Ta), zinc (Zn), manganese (Mn), zirconium (Zr), titanium (Ti), hafnium (Hf), niobium (Nb), vanadium (V), chromium (Cr), scandium (Sc), yttrium (Y), silicon (Si), tungsten (W), molybdenum (Mo), aluminum (Al), titanium nitride (TiN), titanium tungsten (TiW), tantalum nitride (TaN), tungsten nitride (WN), or combinations thereof. Other suitable materials are within the contemplated scope of the present disclosure. In some embodiments, the metal lines 40 may be formed by the following processes.

The barrier layer 401 is formed in each of the trenches by conformally depositing a barrier material layer, which includes, for example, but not limited to, tantalum (Ta), zinc (Zn), manganese (Mn), zirconium (Zr), titanium (Ti), hafnium (Hf), niobium (Nb), vanadium (V), chromium (Cr), scandium (Sc), yttrium (Y), silicon (Si), tungsten (W), molybdenum (Mo), aluminum (Al), titanium nitride (TiN), titanium tungsten (TiW), tantalum nitride (TaN), tungsten nitride (WN), or combinations thereof, on the bottom surface and the sidewall surface of each of the trenches and on the upper surface of the dielectric layer 30 using a suitable deposition process as is known in the art of semiconductor fabrication, such as PVD, CVD, ALD, PEALD, thermal ALD, PECVD, or the like, and then removing excess of the barrier material layer over the dielectric layer 30 by a planarization process (for example, but not limited to, a chemical mechanical planarization (CMP) process, an etching back process, or the like).

The liner layer 402 is then formed on the barrier layer 401 in each of the trenches by conformally depositing a liner material layer, which includes, for example, but not limited to, cobalt (Co), ruthenium (Ru), tantalum (Ta), or the like, or alloys thereof, on the barrier layer 401 in each of the trenches and on the upper surface of the dielectric layer 30 using a suitable deposition process as is known in the art of semiconductor fabrication, such as PVD, CVD, ALD, PEALD, thermal ALD, PECVD, or the like, and then removing excess of the liner material layer over the dielectric layer 30 by a planarization process (for example, but not limited to, the CMP process, the etching back process, or the like).

The bulk metal region 403 is then formed by filling of the metal material for forming the bulk metal region 403 in a remaining volume of each of the trenches using a suitable deposition process as is known to those skilled in the art of semiconductor fabrication, for example, but no limited to, PVD, CVD, ALD, PEALD, PECVD, or the like, and then removing excess of the metal material formed over the dielectric layer 30 by a planarization process (for example, but not limited to, the CMP process, the etching back process, or the like), thereby obtaining the metal lines 40.

Referring to FIG. 1 and the example illustrated in FIG. 3, the method 10 proceeds to step S02, where a cap layer 50 made of a two-dimensional material is formed on the metal lines 40 of the metal layer (Mx). The cap layer 50 includes a plurality of cap portions 51 disposed on the metal lines 40, respectively. In some embodiments, the cap layer 50 may have a thickness ranging from about 3 Å to about 300 Å. In some embodiments, the cap layer 50 may be formed on the metal lines 40 by directly depositing the two-dimensional material on the metal lines 40 using a selective deposition process (for example, but not limited to, selective CVD, selective ALD, selective thermal CVD, selective PECVD, or the like) based on a relatively high deposition selectivity of the two-dimensional material on the metal lines 40 with respect to the dielectric layer 30. In some embodiments, the cap layer 50 may be formed on the metal lines 40 by selectively forming a self-assembled monolayer (SAM) on the dielectric layer 30 without formation of the SAM on the metal lines 40 so as to permit the SAM to serve as a blocking layer, depositing the two-dimensional material on the metal lines 40 by a suitable deposition process (for example, but not limited to, CVD, ALD, thermal CVD, PECVD, or the like), and removing the SAM by, for example, but not limited to, a plasma treatment or other suitable treatments. In some embodiments, the SAM may be formed from a plurality of precursor molecules, each of which includes a head group and a tail connected to the head group. The head group of each of the precursor molecules may be reacted with a functional group at the upper surface of the dielectric layer 30 so as to form the SAM on the dielectric layer 30. In some embodiments, the tail of each of the precursor molecules may include, for example, but not limited to, long-chain alkyl. In some embodiments, the cap layer 50 may be formed on the metal lines 40 by forming a layer of the two-dimensional material on an upper surface of the structure shown in FIG. 2 (i.e., on the upper surface of the dielectric layer 20 and upper surfaces of metal lines 40) using a mechanical exfoliation process, a transfer process (for example, but not limited to, a roll-to-roll transfer process), or the like, and removing a portion of the layer of the two-dimensional material formed on the dielectric layer 30 by a suitable removal process (for example, a plasma treatment through a patterned mask disposed on the layer of the two-dimensional material).

In some embodiments, the two-dimensional material may include, for example, but not limited to, graphene, intercalated graphene, doped graphene, modified graphene, hexagonal boron nitride (h-BN), transition metal dichalcogenide monolayer (TMD) (for example, but not limited to, molybdenum disulfide ($MoS_2$), tantalum disulfide ($TaS_2$), hafnium disulfide ($HfS_2$), tungsten diselenide ($WSe_2$), or the like), borocarbonitride, germanane, $Ni_3$(2,3,6,7,10,11-hexaimino-triphenylene)$_2$ (i.e., $Ni_3(HITP)_2$), or combinations thereof. The intercalated graphene includes a plurality of graphene sheets and an intercalating material intercalated among the graphene sheets. In some embodiments, the intercalating material may include, for example, but not limited to, metal (for example, but not limited to, lithium (Li), potassium (K), cesium (Cs), sodium (Na), or the like, or combinations thereof), organic compound (for example, but not limited to, benzene, pyridine, furan, catechol, or the like, or combinations thereof), inorganic compound (for example, but not limited to, ferric chloride ($FeCl_3$), molybdenum (V) chloride ($MoCl_5$), gold (III) chloride ($AuCl_3$), copper (II) chloride ($CuCl_2$), sulfuric acid ($H_2SO_4$), aluminum chloride ($AlCl_3$), bromine ($Br_2$), chlorine ($Cl_2$), nitric acid ($HNO_3$), or the like, or combinations thereof), polymer or oligomer (for example, but not limited to, poly(methyl methacrylate) (PMMA), polystyrene (PS), polyamide-6 (PA6), or the like, or combinations thereof), or combinations thereof. The doped graphene includes a graphene sheet doped with dopant. In some embodiments, the dopant may include, for example, but not limited to, oxygen (O), nitrogen (N), phosphorus (P), boron (B), or combinations thereof. In some embodiments, the modified graphene may be formed by modifying the graphene sheet using a plasma treatment or various precursors (for example, but not limited to, pyridine, pyrrole, or the like, or combinations thereof) so as to form point defects in the graphene sheet. In some embodiments, the modified graphene may be formed by introducing heteroatom (for example, but not limited to, nitrogen (N)) into graphene using a nitrogen-containing gas (for example, but not limited to, ammonia ($NH_3$)).

Figure 5:
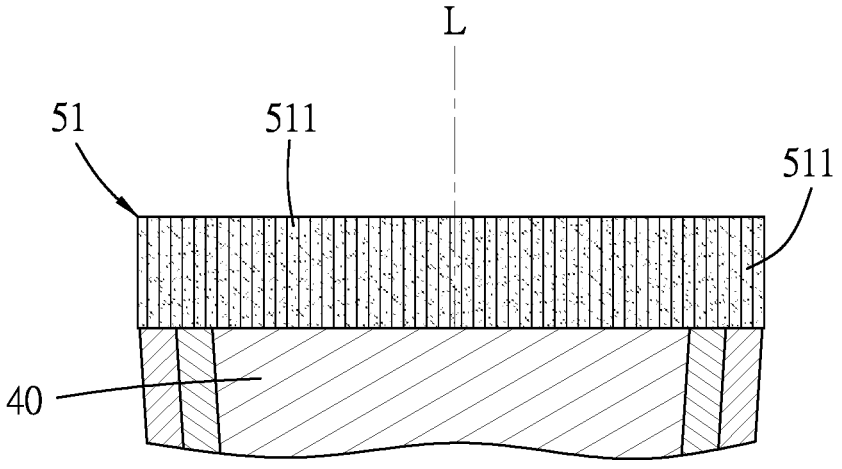
FIGS. 5 to 15 illustrate schematic views of various configurations of a two-dimensional material for forming a cap layer in the semiconductor structure in accordance with some embodiments.

Referring to the examples illustrated in FIGS. 3 and 5, the cap portions 51 are disposed on the metal lines 40, respectively, and each of the cap portions 51 includes a plurality of two-dimensional material sheets 511 stacked on each other. Each of the cap portions 51 has a lower surface proximate to a corresponding one of the metal lines 40 and an upper surface opposite to the lower surface. Each of the two-dimensional material sheets 511 is made of the two-dimensional material described above and extends in a direction parallel to a normal line (L) of the lower surface of a corresponding one of the cap portions 51. Each of the two-dimensional material sheets 511 includes two opposite edges. Each of the two opposite edges is formed with dangling bonds such that in each of the two-dimensional material sheets 511 of each of the cap portions 51, one of the two opposite edges proximate to the lower surface of the each of the cap portions 51 can be bonded to the corresponding one of the metal lines 40 through the dangling bonds formed at the one of the two opposite edges (i.e., at the lower surface of the each of the cap portions 51), so as to enhance adhesion of each of the cap portions 51 to a corresponding one of the metal lines 40 and to increase the vacancy formation energy. In addition, in each of the two-dimensional material sheets 511 of each of the cap portions 51, the other one of the two opposite edges proximate to the upper surface of the each of the cap portions 51 can be bonded to a feature (for example, but not limited to, an etch stop layer 60 shown in FIG. 4, which will be described hereinafter) formed on the cap portions 51 through the dangling bonds formed at the other one of the two opposite edges (i.e., at the upper surface of the each of the cap portions 51), so as to enhance adhesion of the cap portions 51 to the feature formed above the cap portions 51.

Figure 6:
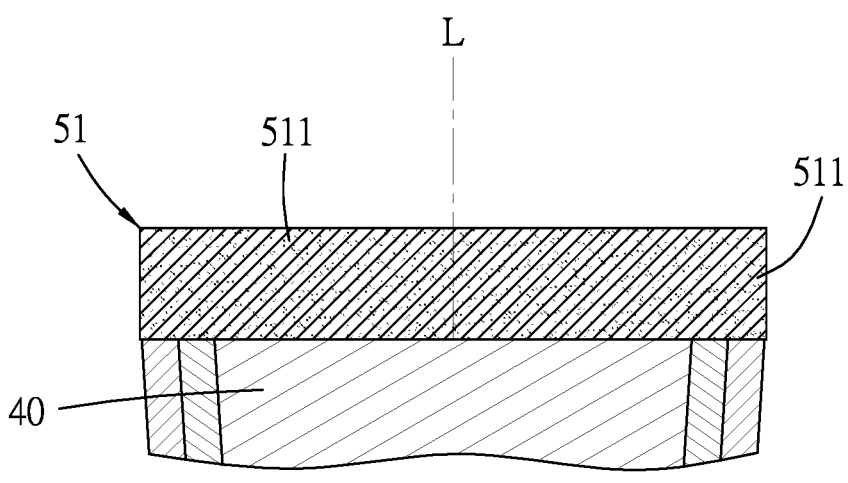

Referring to the examples illustrated in FIGS. 3 and 6, in each of the cap portions 51, each of the two-dimensional material sheets 511 is configured to be inclined with respect to the normal line (L) of the lower surface of the each of the cap portions 51. Similarly, in each of the two-dimensional material sheets 511 of each of the cap portions 51, one of the two opposite edges proximate to the lower surface of the each of the cap portions 51 can be bonded to a corresponding one of the metal lines 40 through the dangling bonds formed at the one of the two opposite edges (i.e., at the lower surface of the each of the cap portions 51), so as to enhance adhesion of each of the cap portions 51 to a corresponding one of the metal lines 40 and to increase the vacancy formation energy. In addition, in each of the two-dimensional material sheets 511 of each of the cap portions 51, the other one of the two opposite edges proximate to the upper surface of the each of the cap portions 51 can be bonded to the feature formed above the cap portions 51 through the dangling bonds formed at the other one of the two opposite edges (i.e., at the upper surface of the each of the cap portions 51), so as to enhance adhesion of the cap portions 51 to the feature formed above the cap portions 51.

Figure 7:
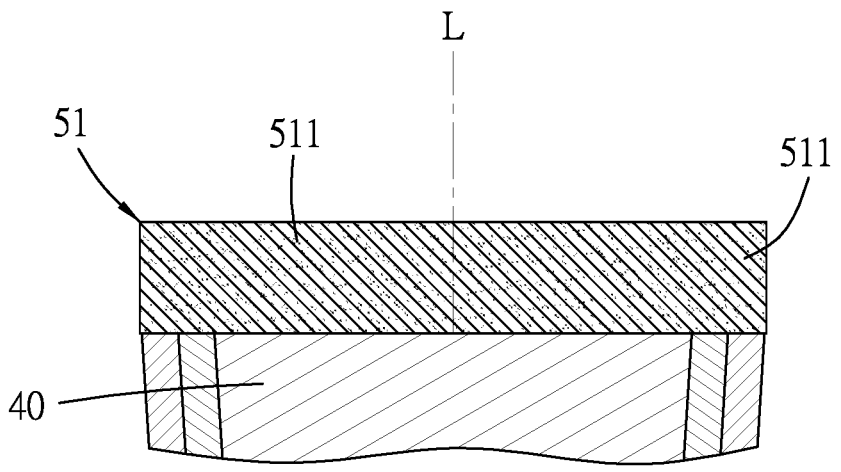

Referring to the examples illustrated in FIGS. 3 and 7, the two-dimensional material sheets 511 of each of the cap portions 51 are arranged in a manner similar to that of the two-dimensional material sheets 511 of each of the cap portions 51 shown in FIG. 6, except that each of the two-dimensional material sheets 511 in each of the cap portions 51 shown in FIG. 7 is configured to be inclined from the normal line (L) of the lower surface of the each of the cap portions 51 in a direction opposite to a direction in which each of the two-dimensional material sheets 511 in each of the cap portions 51 shown in FIG. 6 is inclined from the normal line (L) of the lower surface of the each one of the cap portions 51. Similarly, each of the cap portions 51 can be bonded to a corresponding one of the metal lines 40 disposed therebelow and the feature formed thereabove through the dangling bonds formed at two opposite edges of each of the two-dimensional material sheets 511 in the each of the cap portions 51.

Figure 8:
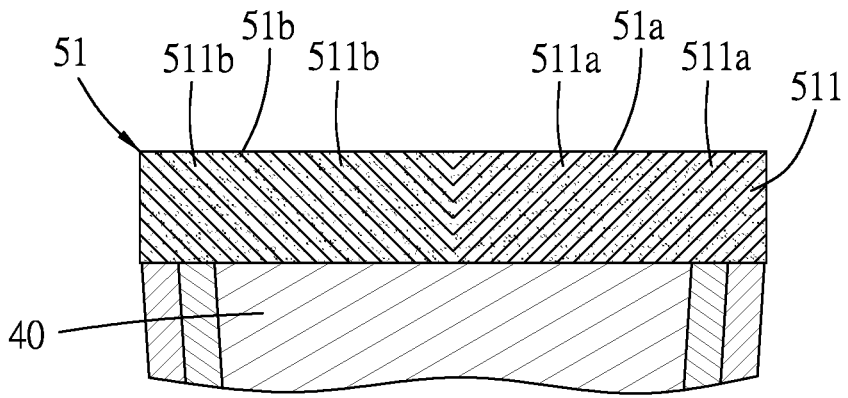

Referring to the examples illustrated in FIGS. 3 and 8, each of the cap portions 51 includes a first cap part 51*a* and a second cap part 51*b* connected to each other. The first cap part 51*a* includes a plurality of first two-dimensional material sheets 511*a* arranged in a manner that is the same as that of the two-dimensional material sheets 511 of each of the cap portions 51 shown in FIG. 6. The second cap part 51*b* includes a plurality of second two-dimensional material sheets 511*b* arranged in a manner that is the same as that of the two-dimensional material sheets 511 of each of the cap portions 51 shown in FIG. 7. Similarly, each of the cap portions 51 can be bonded to a corresponding one of the metal lines 40 disposed therebelow and the feature formed thereabove through the dangling bonds formed at two opposite edges of each of the first two-dimensional material sheets 511*a* and the second two-dimensional material sheets 511*b* in the each of the cap portions 51.

Figure 9:
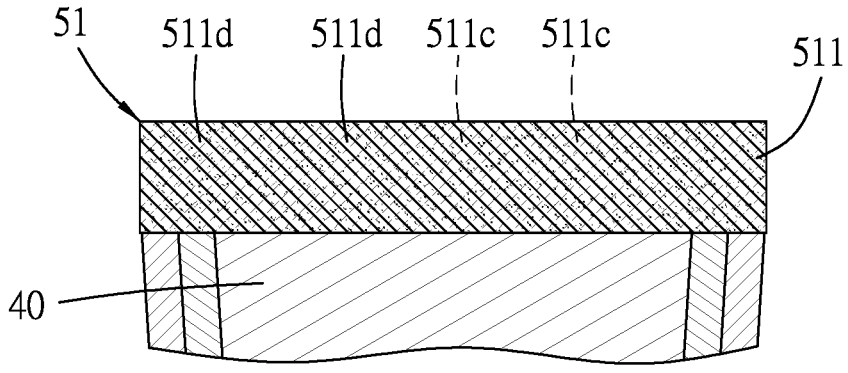

Referring to the examples illustrated in FIGS. 3 and 9, each of the cap portions 51 includes a plurality of first two-dimensional material sheets 511*c* arranged in a manner that is the same as that of the two-dimensional material sheets 511 of each of the cap portions 51 shown in FIG. 6 and a plurality of second two-dimensional material sheets 511*d* arranged in a manner that is the same as that of the two-dimensional material sheets 511 of each of the cap portions 51 shown in FIG. 7. The first two-dimensional material sheets 511*c* and the second two-dimensional material sheets 511*d* intersect with each other. Similarly, each of the cap portions 51 can be bonded to a corresponding one of the metal lines 40 disposed therebelow and the feature formed thereabove through the dangling bonds formed at two opposite edges of each of the first two-dimensional material sheets 511*c* and the second two-dimensional material sheets 511*d* in the each of the cap portions 51.

Figure 10:
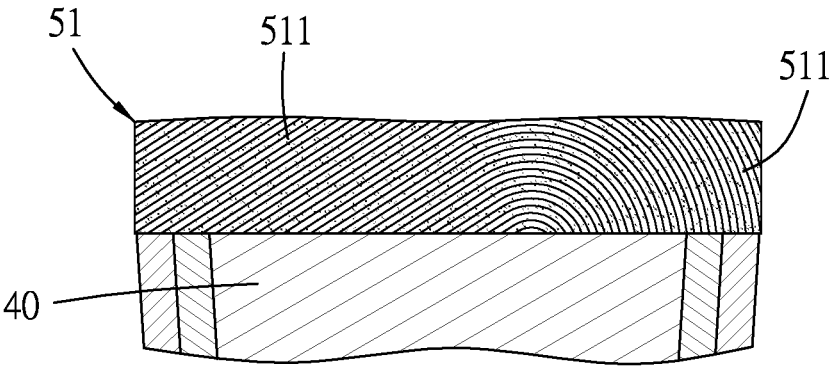

Referring to the examples illustrated in FIGS. 3 and 10, each of the cap portions 51 includes a plurality of the two-dimensional material sheets 511. Each of the two-dimensional material sheets 511 is configured in a curved shape, and includes two opposite edges proximate to the lower surface of the each of the cap portions 51. Each of the two opposite edges is formed with dangling bonds such that in each of the two-dimensional material sheets 511, both of the two opposite edges are bonded to the corresponding one of the metal lines 40 through the dangling bonds so as to enhance adhesion of each of the cap portions 51 to a corresponding one of the metal lines 40 and to increase the vacancy formation energy.

Figure 11:
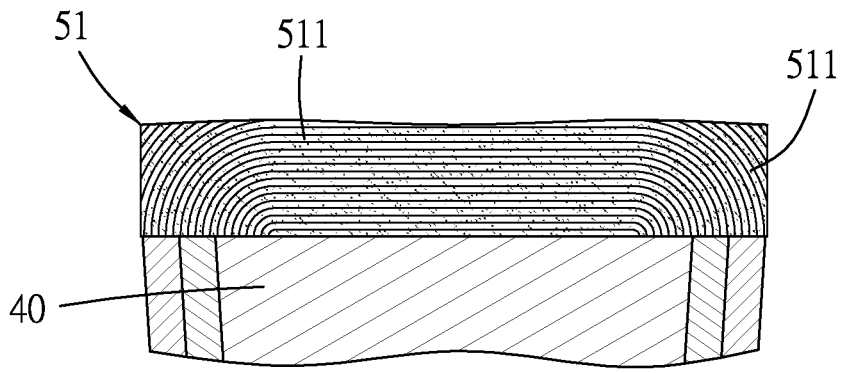

Referring to the examples illustrated in FIGS. 3 and 11, the two-dimensional material sheets 511 of each of the cap portions 51 are arranged in a manner similar to that of the two-dimensional material sheets 511 of each of the cap portions 51 shown in FIG. 10, except that the curved shape of each of the two-dimensional material sheets 511 in each of the cap portions 51 is configured to have a substantially inverted U-shape. Similarly, both of the two opposite edges of each of the two-dimensional material sheets 511 in each of the cap portions 51 are proximate to the lower surface of the each of the cap portions 51, and are bonded to the corresponding one of the metal lines 40 through the dangling bonds so as to enhance adhesion of each of the cap portions 51 to a corresponding one of the metal lines 40 and to increase the vacancy formation energy.

Figure 12:
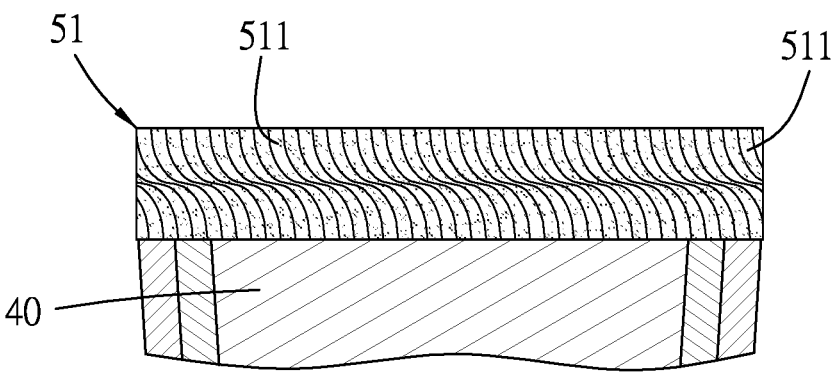

Referring to the examples illustrated in FIGS. 3 and 12, in each of the cap portions 51, each of the two-dimensional material sheets 511 is configured to have a substantially S-shape. Similarly, in each of the two-dimensional material sheets 511 of each of the cap portions 51, one of the two opposite edges proximate to the lower surface of the each of the cap portions 51 is bonded to a corresponding one of the metal lines 40 through the dangling bonds formed at the one of the two opposite edges (i.e., at the lower surface of the each of the cap portions 51), so as to enhance adhesion of each of the cap portions 51 to a corresponding one of the metal lines 40 and to increase the vacancy formation energy. In addition, in each of the two-dimensional material sheets 511 of each of the cap portions 51, the other one of the two opposite edges proximate to the upper surface of the each of the cap portions 51 is bonded to the feature formed above the cap portions 51 through the dangling bonds formed at the other one of the two opposite edges (i.e., at the upper surface of the each of the cap portions 51), so as to enhance adhesion of the cap portions 51 to the feature formed above the cap portions 51.

Figure 13:
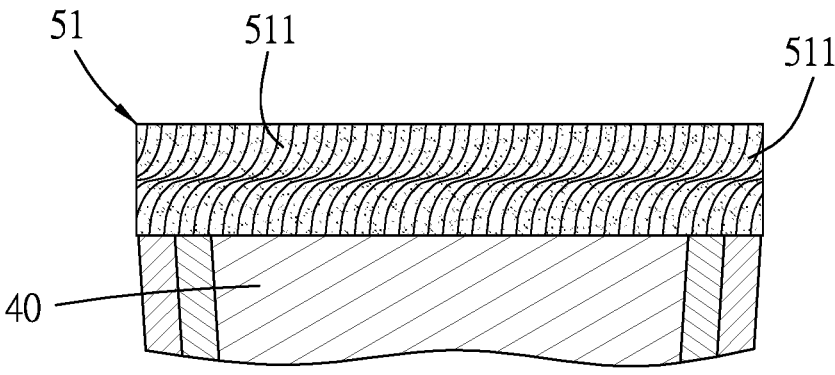

Referring to the examples illustrated in FIGS. 3 and 13, the two-dimensional material sheets 511 of each of the cap portions 51 are arranged in a manner similar to that of the two-dimensional material sheets 511 of each of the cap portions 51 shown in FIG. 12, except that each of the two-dimensional material sheets 511 in each of the cap portions 51 shown in FIG. 13 is configured to have a substantially reversed S-shape.

Figure 14:
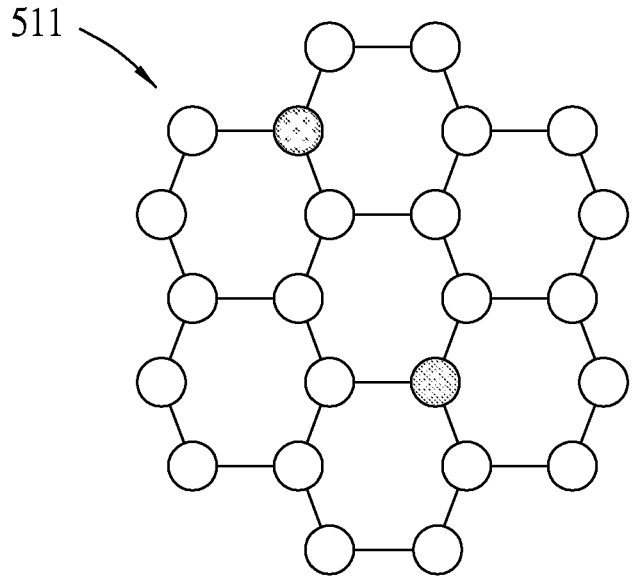

Referring to the examples illustrated in FIGS. 3 and 14, as described above, the two-dimensional material for making the cap layer 50 (i.e., the cap portions 51) may be doped graphene, which includes the graphene sheet doped with the dopant. In some embodiments, the dopant may include, for example, but not limited to, oxygen (O), nitrogen (N), phosphorus (P), boron (B), or combinations thereof. FIG. 14 illustrates the two-dimensional material sheets 511 including the doped graphene, in which the graphene sheet is doped with two different dopants (for example, but not limited to, oxygen and nitrogen) therein. When the two-dimensional material sheets 511 are made of the doped graphene, the two-dimensional material sheets 511 in the cap portions 51 are arranged to extend in a direction parallel to the lower surface of a corresponding one of the cap portions 51. In this case, the dangling bonds resulted from the presence of the dopant(s) in the graphene sheet can be formed at one or both of an upper surface and a lower surface of each of the cap portions 51 depending on the position(s) at which one or more of the two-dimensional material sheets 511 made of the doped graphene is (arc) disposed. For example, when one or more of the two-dimensional material sheets 511 made of the doped graphene is (are) disposed at or proximate to the lower surface of each of the cap portions 51, the dangling bonds are formed at the lower surface of each of the cap portions 51 so as to permit the cap portions 51 to be bonded to the metal lines 40, respectively, through the dangling bonds. When one or more of the two-dimensional material sheets 511 made of the doped graphene is (arc) disposed at or proximate to both of the upper surface and the lower surface of each of the cap portions 51, the dangling bonds are formed at the upper surface and the lower surface of each of the cap portions 51 so as to permit the cap portions 51 to be bonded to the metal lines 40, respectively, and to be bonded to the feature disposed above the cap portions 51 through the dangling bonds.

Figure 15:
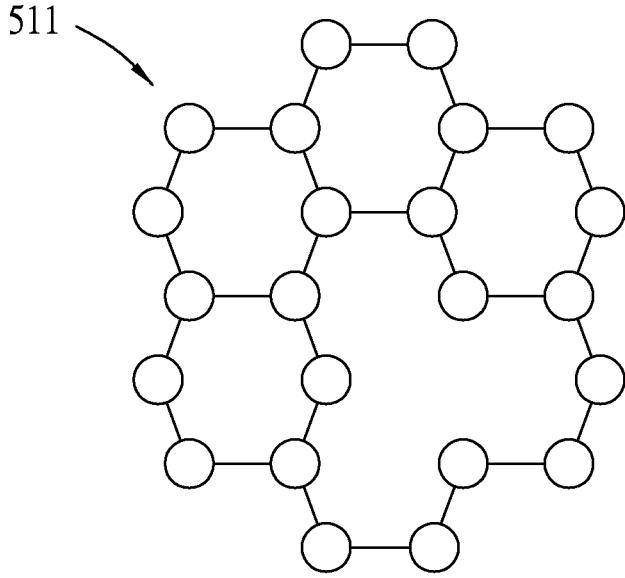

Referring to the examples illustrated in FIGS. 3 and 15, as described above, the two-dimensional material for making the cap layer 50 (i.e., the cap portions 51) may be modified graphene, which can be a graphene sheet formed with point defect as shown in FIG. 15. When the two-dimensional material sheets 511 are made of the modified graphene, the two-dimensional material sheets 511 in the cap portions 51 are arranged to extend in the direction parallel to the lower surface of a corresponding one of the cap portions 51. In this case, the dangling bonds can be formed at one or both of an upper surface and a lower surface of each of the cap portions 51 depending on the position(s) at which one or more of the two-dimensional material sheets 511 made of the modified graphene is (arc) disposed. For example, when one or more of the two-dimensional material sheets 511 made of the modified graphene is (are) disposed at or proximate to the lower surface of each of the cap portions 51, the dangling bonds are formed at the lower surface of each of the cap portions 51 so as to permit the cap portions 51 to be bonded to the metal lines 40, respectively, through the dangling bonds. When one or more of the two-dimensional material sheets 511 made of the modified graphene is (are) disposed at or proximate to both of the upper surface and the lower surface of each of the cap portions 51, the dangling bonds are formed at the upper surface and the lower surface of each of the cap portions 51 so as to permit the cap portions 51 to be bonded to the metal lines 40, respectively, and to be bonded to the feature disposed above the cap portions 51 through the dangling bonds.

Referring to FIG. 1 and the example illustrated in FIG. 4, the method 10 proceeds to step S03, where an etch stop layer 60 is formed. The etch stop layer 60 is formed on the structure shown in FIG. 3 so as to cover the dielectric layer 30 and the cap layer 50 (i.e., the cap portions 51). In some embodiments, the etch stop layer 60 is formed by a suitable deposition process as is known in the art of semiconductor fabrication, such as PVD, CVD, ALD, PEALD, thermal ALD, PECVD, or the like. Other suitable deposition techniques are within the contemplated scope of the present disclosure. In some embodiments, the etch stop layer 60 may include silicon nitride, silicon nitride doped with carbon, silicon oxide, silicon oxynitride, silicon oxynitride doped with carbon, amorphous carbon material, silicon carbide, silicon oxycarbide, other nitride materials, other carbide materials, aluminum oxide, other metal oxides, aluminum nitride, other metal nitrides (e.g., titanium nitride, or the like), boron nitride, boron carbide, and other low-k dielectric materials or low-k dielectric materials doped with one or more of carbon, nitrogen, and hydrogen, or other suitable materials. Other suitable materials are within the contemplated scope of the present disclosure. When the cap portions 51 formed below the etch stop layer 60 have any one of the configurations shown in FIGS. 5-9 and 12-13, the cap portions 51 can be additionally bonded to corresponding portions of the etch stop layer 60, respectively, through the dangling bonds formed at the upper surfaces thereof so as to adhesion of the cap portions 51 to the etch stop layer 60. In addition, when one or more of the two-dimensional material sheets 511 made of the doped graphene or the modified graphene is (arc) disposed at or proximate to both of the upper surface and the lower surface of each of the cap portions 51, the dangling bonds are formed at the upper surface and the lower surface of each of the cap portions 51 so as to permit the cap portions 51 to be bonded to the metal lines 40, respectively, and to be bonded to the etch stop layer 60 through the dangling bonds.

Figure 16:
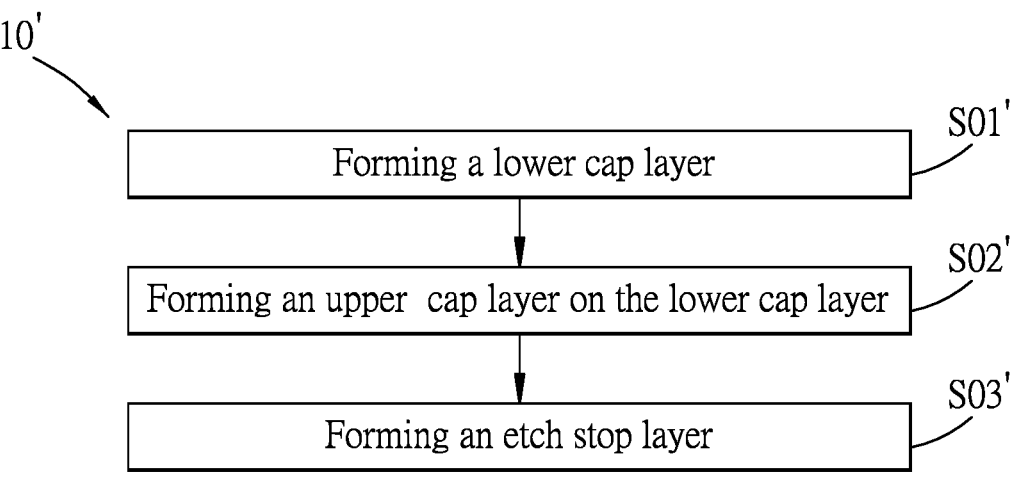
FIG. 16 is a flow diagram illustrating a method for manufacturing a semiconductor structure in accordance with some embodiments.
Figure 17:
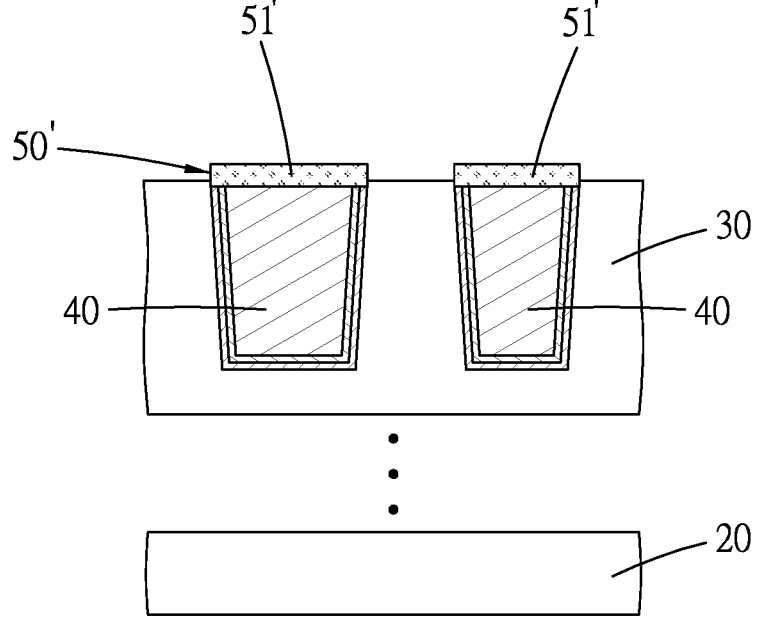
FIGS. 17 to 19 illustrate schematic views of some intermediate stages of the method depicted in FIG. 16 in accordance with some embodiments.
Figure 18:
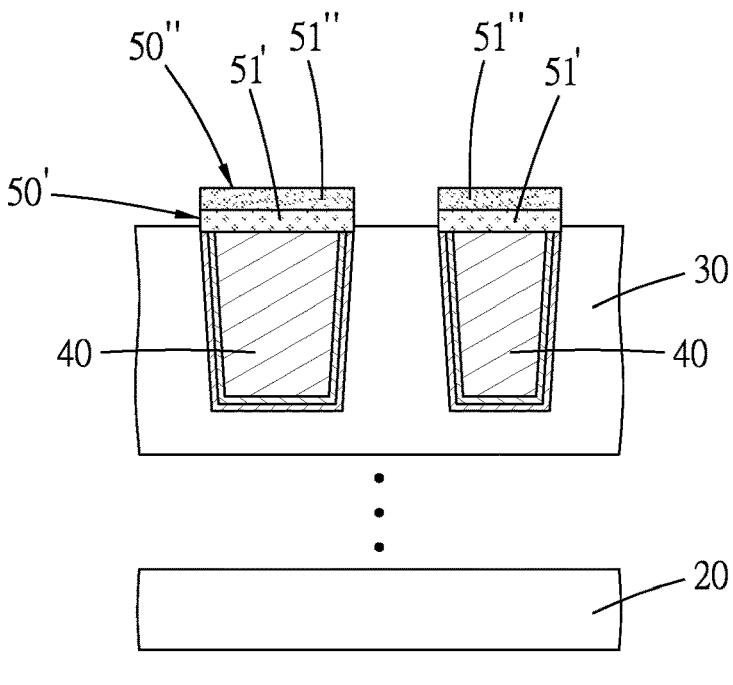
Figure 19:
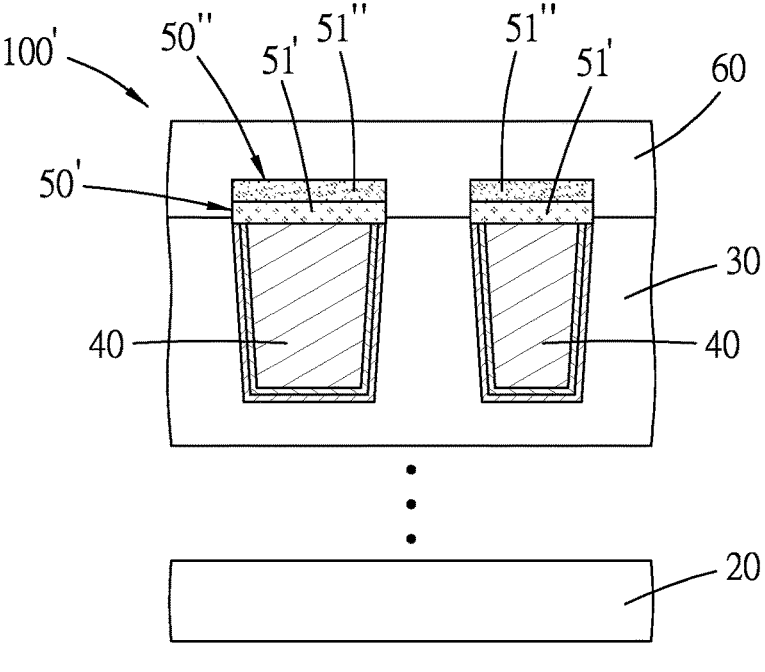

FIG. 16 is a flow diagram illustrating a method 10' for manufacturing a semiconductor structure (for example, a semiconductor structure 100' shown in FIG. 19) in accordance with some embodiments. FIGS. 17 to 19 illustrate schematic views of some intermediate stages of the method 10' in accordance with some embodiments. Some repeating structures and some components are omitted in FIGS. 17 to 19 for the sake of brevity. Additional steps can be provided before, after or during the method 10', and some of the steps described herein may be replaced by other steps or be eliminated. Similarly, further additional features may be present in the semiconductor device 100', and/or features present may be replaced or eliminated in additional embodiments.

Referring to FIG. 16 and the example illustrated in FIG. 17, the method 10' begins at step S01', where a lower cap layer 50' is formed. The lower cap layer 50' is formed on the metal lines 40 of the metal layer (Mx) of the structure shown in FIG. 2, and includes a plurality of lower cap portions 51' disposed on the upper surfaces of the metal lines 40, respectively. The metal layer (Mx) and the lower cap layer 50' are collectively configured as the interconnect structure, and each of the metal lines 40 and a corresponding one of the lower cap portions 51' are collectively configured as the conductive interconnect. In some embodiments, the lower cap layer 51' may be made of a metal-containing material, examples of which include metal (for example, but not limited to, cobalt (Co), ruthenium (Ru), or the like), alloy (for example, Co—Ru alloy, or the like), metal oxide (for example, but not limited to, platinum cobalt oxide ($PtCoO_2$), palladium cobalt oxide ($PdCoO_2$), or the like), metal nitride (for example, but not limited to, titanium nitride (TiN), or the like), and combinations thereof. In some embodiments, the lower cap layer 50' may have a thickness ranging from about 3 Å to about 300 Å. Similar to the formation of the cap layer 50 with reference to FIG. 3, the lower cap layer 50' may be formed on the metal lines 40 by directly depositing the metal-containing material on the metal lines 40 using a selective deposition process, or by selectively forming the SAM on the dielectric layer 30, depositing the metal-containing material on the metal lines 40 by a suitable deposition process with use of the SAM as a blocking layer, and removing the blocking layer.

Referring to FIG. 16 and the example illustrated in FIG. 18, the method 10' proceeds to step S02', where an upper cap layer 50" is formed. The upper cap layer 50" is formed on the lower cap layer 50' of the structure shown in FIG. 17, and includes a plurality of upper cap portions 51" disposed on the lower cap portions 51', respectively. In some embodiments, the upper cap layer 50" may have a thickness ranging from about 3 Å to about 300 Å. The upper cap layer 50" may be formed using the processes and the materials for the formation of the cap layer 50 described above with reference to FIG. 3, and thus details thereof are omitted for the sake of brevity. Each of the upper cap portions 51" of the upper cap layer 50" may include the two-dimensional material sheets 511 having any one of the configurations shown in FIGS. 5 to 15 for each of the cap portions 51 of the cap layer 50 shown in FIG. 3. Therefore, the upper cap portions 51" can be bonded to the lower cap portions 51', respectively, through the dangling bonds formed at lower surfaces thereof so as to adhere the upper cap portions 51" to the lower cap portions 51' and to increase the vacancy formation energy.

Referring to FIG. 16 and the example illustrated in FIG. 19, the method 10' proceeds to step S03', where the etch stop layer 60 is formed. The etch stop layer 60 is formed on the structure shown in FIG. 18 so as to cover the dielectric layer 30, the lower cap portions 51', and the upper cap portions 51". The etch stop layer 60 may be formed using the processes and the materials described above with reference to FIG. 4, and thus details thereof are omitted for the sake of brevity. When the upper cap portions 51" formed below the etch stop layer 60 include the two-dimensional material sheets 511 having any one of the configurations shown in FIGS. 5-9 and 12-15, the upper cap portions 51" can be bonded to corresponding portions of the etch stop layer 60, respectively, through the dangling bonds formed at the upper surfaces thereof so as to adhere the upper cap portions 51" to the etch stop layer 60.

Figure 20:
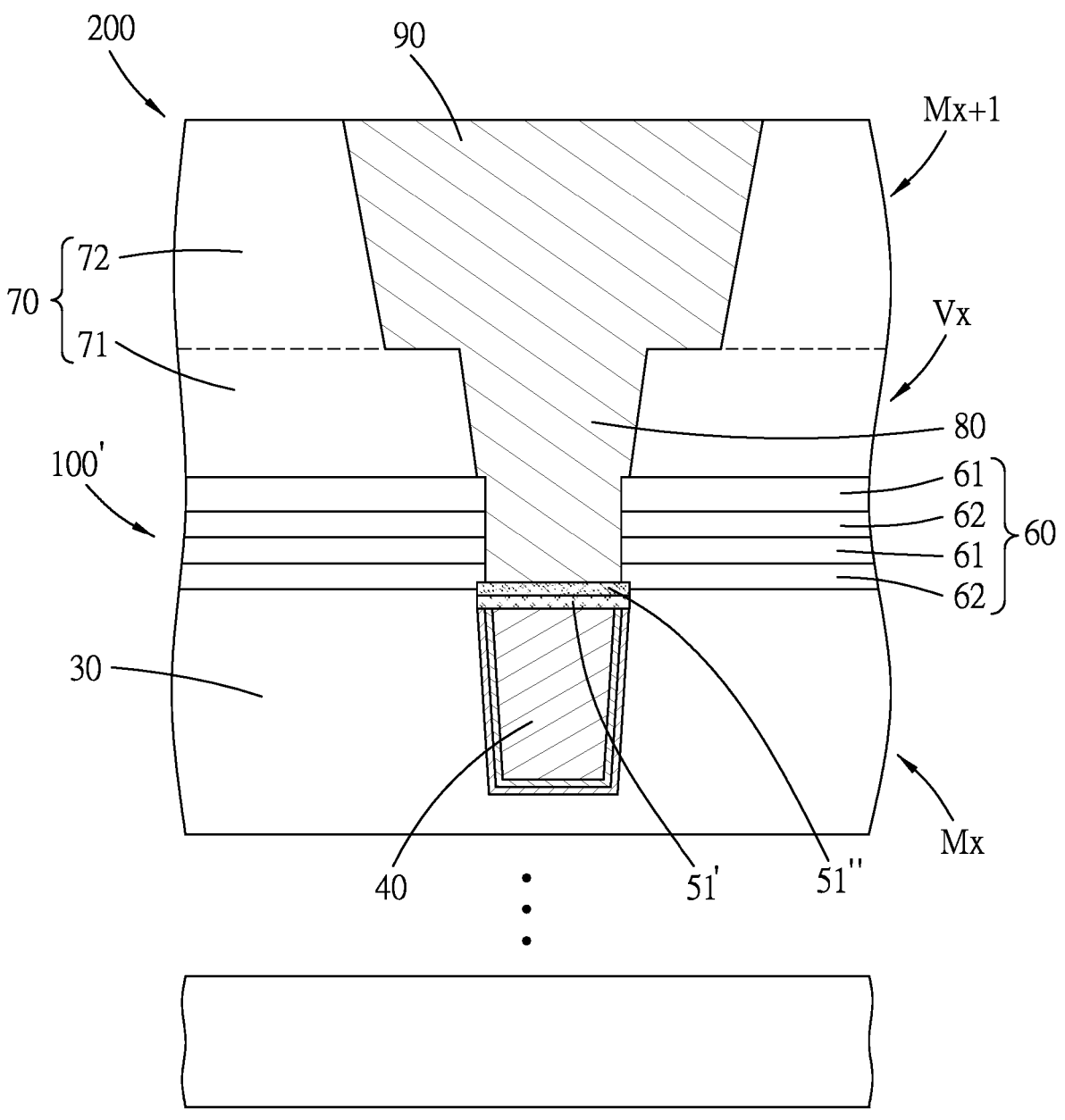
FIG. 20 illustrates a schematic view of an interconnect structure on the semiconductor structure in accordance with some embodiments.

Referring to the example illustrated in FIG. 20, an interconnect structure 200 is formed on the semiconductor structure 100' shown in FIG. 19. The interconnect structure 200 includes a dielectric layer 70, a plurality of conductive vias 80, and a plurality of metal lines 90. The dielectric layer 70 includes a lower dielectric layer portion 71 disposed on the etch stop layer 60 and an upper dielectric layer portion 72 disposed on the lower dielectric layer portion 71 opposite to the etch stop layer 60. The conductive vias 80 are disposed in the lower dielectric layer portion 71 and extends downwardly to penetrate through the etch stop layer 60 and to terminate at a corresponding one of the upper cap portions 51". The metal lines 90 are disposed in the upper dielectric layer portions 71 and are spaced apart from each other. Only one of the metal lines 90 and one of the conductive vias are shown in FIG. 20. One or more of the conductive via 80 is (are) connected to one or more of the metal lines 90, respectively. The interconnect structure 200 may be formed using a dual damascene process so as to form a via layer (Vx) and a metal layer (Mx+1) simultaneously. The via layer (Vx) is disposed on the etch stop layer 60 and includes the conductive vias 80. The metal layer (Mx+1) is disposed on the via layer (Vx) opposite to the etch stop layer 60, and includes the metal lines 90. Alternatively, the via layer (Vx) and the metal layer (Mx+1) may be formed sequentially and separately using two single damascene processes. In some embodiments, the etch stop layer 60 may be a stack assembly of at least one first etch stop sub-layers 61 and at least one second etch stop sub-layer 62 which are alternately stacked on the dielectric layer 30. In some embodiments, the number of the at least one first etch stop sub-layer 61 is two and the number of the at least one second etch stop sub-layer 62 is two. The first etch stop sub-layer 61 and the second etch stop sub-layer 62 are different from each other, and each of them may independently include the material described above for the etch stop layer 60. Similarly, the interconnect structure 200 may be formed on the semiconductor structure 100 shown in FIG. 4.

In a semiconductor structure of the present disclosure, a cap layer made of a two-dimensional material is formed on metal lines or another cap layer which is disposed on the metal lines and which is made of a metal-containing material, and includes dangling bonds at least at a lower surface thereof, such that the cap layer made of the two-dimensional material can be bonded to the metal lines or the another cap layer through the dangling bonds so as to enhance adhesion of the cap layer made of the two-dimensional material to the metal lines and the another cap layer made of the metal-containing material while the reduced resistance of the metal lines contributed by the two-dimensional material is maintained. Therefore, the reliability of the semiconductor structure can be enhanced.

In accordance with some embodiments of the present disclosure, a semiconductor structure includes a semiconductor substrate, an interconnect structure, and a first cap layer. The interconnect structure is disposed on the semiconductor substrate and includes a conductive interconnect. The first cap layer is disposed on the interconnect structure and includes a first cap portion disposed on the conductive interconnect. The first cap portion includes a plurality of two-dimensional material sheets stacked on each other and has a lower surface proximate to the conductive interconnect. The lower surface of the first cap portion is formed with a plurality of dangling bonds such that the first cap portion is adhered to the conductive interconnect through the dangling bonds.

In accordance with some embodiments of the present disclosure, the conductive interconnect is a metal line such that the first cap portion is adhered to the metal line through the dangling bonds formed at the lower surface of the first cap portion.

In accordance with some embodiments of the present disclosure, the interconnect structure further includes a second cap layer including a second cap portion. The conductive interconnect includes a metal line and the second cap portion disposed on the metal line such that the first cap portion is adhered to the second cap portion of the conductive interconnect through the dangling bonds formed at the lower surface of the first cap portion.

In accordance with some embodiments of the present disclosure, the semiconductor structure further includes an etch stop layer disposed on the interconnect structure. The first cap portion further has an upper surface opposite to the lower surface. The upper surface of the first cap portion is formed with a plurality of the dangling bonds such that the first cap portion is adhered to the etch stop layer through the dangling bonds formed at the upper surface of the first cap portion.

In accordance with some embodiments of the present disclosure, each of the two-dimensional material sheets includes two opposite edges, each of which is formed with the dangling bonds. At least one of the two opposite edges of each of the two-dimensional material sheets is proximate to the lower surface of the first cap portion and is bonded to the conductive interconnect through the dangling bonds formed at the at least one of the two opposite edges of each of the two-dimensional material sheets so as to permit the first cap portion to be adhered to the conductive interconnect.

In accordance with some embodiments of the present disclosure, each of the two-dimensional material sheets includes two opposite edges, each of which is formed with the dangling bonds. One of the two opposite edges of each of the two-dimensional material sheets is proximate to the lower surface of the first cap portion and is bonded to the conductive interconnect through the dangling bonds formed at the one of the two opposite edges of each of the two-dimensional material sheets so as to permit the first cap portion to be adhered to the conductive interconnect. The other one of the two opposite edges of each of the two-dimensional material sheets is proximate to the upper surface of the first cap portion and is bonded to the etch stop layer through the dangling bonds formed at the other one of the two opposite edges of each of the two-dimensional material sheets so as to permit the first cap portion to be adhered to the etch stop layer.

In accordance with some embodiments of the present disclosure, the two-dimensional material sheets includes a two-dimensional material which includes graphene, intercalated graphene, doped graphene, modified graphene, hexagonal boron nitride, transition metal dichalcogenide monolayer borocarbonitride, germanane, $Ni_3(2,3,6,7,10,11$-hexaiminotriphenylene)$_2$, or combinations thereof.

In accordance with some embodiments of the present disclosure, the two-dimensional material sheets are arranged to extend in a direction parallel to the lower surface of the first cap portion. At least one of the two-dimensional material sheets proximate to the lower surface of the first cap portion includes the doped graphene, which includes a graphene sheet doped with a dopant including oxygen, nitrogen, phosphorus, boron, or combinations thereof, so as to permit the lower surface of the first cap portion to be formed with the dangling bonds.

In accordance with some embodiments of the present disclosure, the two-dimensional material sheets are arranged to extend in a direction parallel to the lower surface of the first cap portion. At least one of the two-dimensional material sheets proximate to the lower surface of the first cap portion includes the modified graphene, which includes a graphene sheet formed with point defect, so as to permit the lower surface of the first cap portion to be formed with the dangling bonds.

In accordance with some embodiments of the present disclosure, a semiconductor structure includes a semiconductor substrate, an interconnect structure, and a cap layer. The interconnect structure is disposed on the semiconductor substrate and includes a dielectric layer and a plurality of conductive interconnects disposed in the dielectric layer and spaced apart from each other. The cap layer is disposed on the interconnect structure and includes a plurality of cap portions disposed on the conductive interconnects, respectively. Each of the cap portions includes a plurality of two-dimensional material sheets stacked on each other and has a lower surface in contact with a corresponding one of the conductive interconnects. The lower surface of each of the cap portions is formed with a plurality of dangling bonds such that the cap portions are respectively adhered to the conductive interconnects through the dangling bonds formed at the lower surface of each of the cap portions.

In accordance with some embodiments of the present disclosure, the semiconductor structure further includes an etch stop layer disposed on the interconnect structure. Each of the cap portions further has an upper surface opposite to the lower surface. The upper surface of each of the cap portions is formed with a plurality of the dangling bonds such that the cap portions are adhered to the etch stop layer through the dangling bonds formed at the upper surface of each of the cap portions.

In accordance with some embodiments of the present disclosure, each of the two-dimensional material sheets includes two opposite edges, each of which is formed with the dangling bonds. At least one of the two opposite edges of each of the two-dimensional material sheets is proximate to the lower surface of a corresponding one of the cap portions and is bonded to a corresponding one of the conductive interconnects through the dangling bonds formed at the at least one of the two opposite edges of each of the two-dimensional material sheets so as to permit the cap portions to be respectively adhered to the conductive interconnects.

In accordance with some embodiments of the present disclosure, each of the two-dimensional material sheets is configured to have a curved shape. Both of the two opposite edges of each of the two-dimensional material sheets are proximate to the lower surface of a corresponding one of the cap portions and are bonded to a corresponding one of the conductive interconnects through the dangling bonds formed at both of the two opposite edges of each of the two-dimensional material sheets so as to permit the cap portions to be respectively adhered to the conductive interconnects.

In accordance with some embodiments of the present disclosure, each of the two-dimensional material sheets includes two opposite edges, each of which is formed with the dangling bonds. One of the two opposite edges of each of the two-dimensional material sheets is proximate to the lower surface of a corresponding one of the cap portions and is bonded to a corresponding one of the conductive interconnects through the dangling bonds formed at the one of the two opposite edges of each of the two-dimensional material sheets so as to permit the cap portions to be respectively adhered to the conductive interconnects. The other one of the two opposite edges of each of the two-dimensional material sheets is proximate to the upper surface of a corresponding one of the cap portions and is bonded to the etch stop layer through the dangling bonds formed at the other one of the two opposite edges of each of the two-dimensional material sheets so as to permit the cap portions to be adhered to the etch stop layer.

In accordance with some embodiments of the present disclosure, each of the two-dimensional material sheets extends in a direction parallel to a normal line of the lower surface of each of the cap portions.

In accordance with some embodiments of the present disclosure, each of the two-dimensional material sheets is configured to be inclined with respect to a normal line of the lower surface of each of the cap portions.

In accordance with some embodiments of the present disclosure, each of the two-dimensional material sheets is configured to have one of a substantially S-shape and a substantially reversed S-shape.

In accordance with some embodiments of the present disclosure, a method for manufacturing a semiconductor structure includes: forming an interconnect structure on a semiconductor substrate, the interconnect structure including a dielectric layer and a plurality of conductive interconnects disposed in the dielectric layer and spaced apart from each other; and selectively depositing a two-dimensional material on the conductive interconnects to form a first cap layer including a plurality of first cap portions, each of which is configured to be formed with dangling bonds at a lower surface thereof such that the first cap portions are respectively adhered to the conductive interconnects through the dangling bonds.

In accordance with some embodiments of the present disclosure, formation of the interconnect structure includes forming a plurality of metal lines in the dielectric layer such that each of the metal lines is configured as one of the conductive interconnect. The first cap portions are respectively adhered to the metal lines through the dangling bonds after formation of the cap layer.

In accordance with some embodiments of the present disclosure, formation of the interconnect structure includes forming a plurality of metal lines in the dielectric layer and selectively forming a second cap layer on the metal lines. The second cap layer includes a plurality of second cap portions respectively formed on the metal lines such that each of the metal lines and a corresponding one of the second cap portions are collectively configured as one of the conductive interconnect. The first cap portions are respectively adhered to the second cap portions through the dangling bonds after formation of the cap layer.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a semiconductor substrate;
   an interconnect structure disposed on the semiconductor substrate and including a conductive interconnect; and
   a first cap layer which is disposed on the interconnect structure and which includes a first cap portion disposed on the conductive interconnect, the first cap portion including a plurality of two-dimensional material sheets stacked on each other and having a lower surface proximate to the conductive interconnect, the lower surface of the first cap portion being formed with a plurality of dangling bonds such that the first cap portion is adhered to the conductive interconnect through the dangling bonds.

2. The semiconductor structure as claimed in claim 1, wherein
the conductive interconnect is a metal line such that the first cap portion is adhered to the metal line through the dangling bonds formed at the lower surface of the first cap portion.

3. The semiconductor structure as claimed in claim 1, wherein
the interconnect structure further includes a second cap layer including a second cap portion; and
the conductive interconnect includes a metal line and the second cap portion disposed on the metal line such that the first cap portion is adhered to the second cap portion of the conductive interconnect through the dangling bonds formed at the lower surface of the first cap portion.

4. The semiconductor structure as claimed in claim 1, further comprising an etch stop layer disposed on the interconnect structure, the first cap portion further having an upper surface opposite to the lower surface, the upper surface of the first cap portion being formed with a plurality of the dangling bonds such that the first cap portion is adhered to the etch stop layer through the dangling bonds formed at the upper surface of the first cap portion.

5. The semiconductor structure as claimed in claim 1, wherein
each of the two-dimensional material sheets includes two opposite edges, each of which is formed with the dangling bonds; and
at least one of the two opposite edges of each of the two-dimensional material sheets is proximate to the lower surface of the first cap portion and is bonded to the conductive interconnect through the dangling bonds formed at the at least one of the two opposite edges of each of the two-dimensional material sheets so as to permit the first cap portion to be adhered to the conductive interconnect.

6. The semiconductor structure as claimed in claim 4, wherein
each of the two-dimensional material sheets includes two opposite edges, each of which is formed with the dangling bonds;
one of the two opposite edges of each of the two-dimensional material sheets is proximate to the lower surface of the first cap portion and is bonded to the conductive interconnect through the dangling bonds formed at the one of the two opposite edges of each of the two-dimensional material sheets so as to permit the first cap portion to be adhered to the conductive interconnect; and
the other one of the two opposite edges of each of the two-dimensional material sheets is proximate to the upper surface of the first cap portion and is bonded to the etch stop layer through the dangling bonds formed at the other one of the two opposite edges of each of the two-dimensional material sheets so as to permit the first cap portion to be adhered to the etch stop layer.

7. The semiconductor structure as claimed in claim 1, wherein the two-dimensional material sheets includes a two-dimensional material which includes graphene, intercalated graphene, doped graphene, modified graphene, hexagonal boron nitride, transition metal dichalcogenide monolayer borocarbonitride, germanane, Ni$_3$(2,3,6,7,10,11-hexaiminotriphenylene)$_2$, or combinations thereof.

8. The semiconductor structure as claimed in claim 7, wherein:
the two-dimensional material sheets are arranged to extend in a direction parallel to the lower surface of the first cap portion; and
at least one of the two-dimensional material sheets proximate to the lower surface of the first cap portion includes the doped graphene, which includes a graphene sheet doped with a dopant including oxygen, nitrogen, phosphorus, boron, or combinations thereof, so as to permit the lower surface of the first cap portion to be formed with the dangling bonds.

9. The semiconductor structure as claimed in claim 7, wherein:
the two-dimensional material sheets are arranged to extend in a direction parallel to the lower surface of the first cap portion; and
at least one of the two-dimensional material sheets proximate to the lower surface of the first cap portion includes the modified graphene, which includes a graphene sheet formed with point defect, so as to permit the lower surface of the first cap portion to be formed with the dangling bonds.

10. A semiconductor structure, comprising:
a semiconductor substrate;
an interconnect structure which is disposed on the semiconductor substrate and which includes a dielectric layer and a plurality of conductive interconnects disposed in the dielectric layer and spaced apart from each other; and
a cap layer which is disposed on the interconnect structure and which includes a plurality of cap portions disposed on the conductive interconnects, respectively, each of the cap portions including a plurality of two-dimensional material sheets stacked on each other and having a lower surface in contact with a corresponding one of the conductive interconnects, the lower surface of each of the cap portions being formed with a plurality of dangling bonds such that the cap portions are respectively adhered to the conductive interconnects through the dangling bonds formed at the lower surface of each of the cap portions.

11. The semiconductor structure as claimed in claim 10, further comprising an etch stop layer disposed on the interconnect structure, each of the cap portions further having an upper surface opposite to the lower surface, the upper surface of each of the cap portions being formed with a plurality of the dangling bonds such that the cap portions are adhered to the etch stop layer through the dangling bonds formed at the upper surface of each of the cap portions.

12. The semiconductor structure as claimed in claim 10, wherein
each of the two-dimensional material sheets includes two opposite edges, each of which is formed with the dangling bonds; and
at least one of the two opposite edges of each of the two-dimensional material sheets is proximate to the lower surface of a corresponding one of the cap portions and is bonded to a corresponding one of the conductive interconnects through the dangling bonds formed at the at least one of the two opposite edges of each of the two-dimensional material sheets so as to permit the cap portions to be respectively adhered to the conductive interconnects.

13. The semiconductor structure as claimed in claim 12, wherein each of the two-dimensional material sheets is configured to have a curved shape; and both of the two opposite edges of each of the two-dimensional material sheets are proximate to the lower surface of a corresponding one of the cap portions and are bonded to a corresponding one of the conductive interconnects through the dangling bonds formed at both of the two opposite edges of each of the two-dimensional material sheets so as to permit the cap portions to be respectively adhered to the conductive interconnects.

14. The semiconductor structure as claimed in claim 11, wherein each of the two-dimensional material sheets includes two opposite edges, each of which is formed with the dangling bonds; and one of the two opposite edges of each of the two-dimensional material sheets is proximate to the lower surface of a corresponding one of the cap portions and is bonded to a corresponding one of the conductive interconnects through the dangling bonds formed at the one of the two opposite edges of each of the two-dimensional material sheets so as to permit the cap portions to be respectively adhered to the conductive interconnects; and the other one of the two opposite edges of each of the two-dimensional material sheets is proximate to the upper surface of a corresponding one of the cap portions and is bonded to the etch stop layer through the dangling bonds formed at the other one of the two opposite edges of each of the two-dimensional material sheets so as to permit the cap portions to be adhered to the etch stop layer.

15. The semiconductor structure as claimed in claim 14, wherein each of the two-dimensional material sheets extends in a direction parallel to a normal line of the lower surface of each of the cap portions.

16. The semiconductor structure as claimed in claim 14, wherein each of the two-dimensional material sheets is configured to be inclined with respect to a normal line of the lower surface of each of the cap portions.

17. The semiconductor structure as claimed in claim 14, wherein each of the two-dimensional material sheets is configured to have one of a substantially S-shape and a substantially reversed S-shape.

18. A method for manufacturing a semiconductor structure, comprising:

forming an interconnect structure on a semiconductor substrate, the interconnect structure including a dielectric layer and a plurality of conductive interconnects disposed in the dielectric layer and spaced apart from each other; and selectively depositing two-dimensional material sheets on the conductive interconnects to form a first cap layer including a plurality of first cap portions, each of which is configured to be formed with dangling bonds at a lower surface thereof such that the first cap portions are respectively adhered to the conductive interconnects through the dangling bonds.

19. The method as claimed in claim 18, wherein formation of the interconnect structure includes forming a plurality of metal lines in the dielectric layer and selectively forming a second cap layer on the metal lines, the second cap layer including a plurality of second cap portions respectively formed on the metal lines such that each of the metal lines and a corresponding one of the second cap portions are collectively configured as one of the conductive interconnects; and the first cap portions are respectively adhered to the second cap portions through the dangling bonds after formation of the first cap layer.

20. The method as claimed in claim 18, wherein the two-dimensional material sheets includes a two-dimensional material which includes graphene, intercalated graphene, doped graphene, modified graphene, hexagonal boron nitride, transition metal dichalcogenide monolayer borocarbonitride, germanane, $Ni_3(2,3,6,7,10,11$-hexaiminotriphenylene$)_2$, or combinations thereof.

* * * * *